(12) United States Patent
Nygren et al.

(10) Patent No.: US 12,002,541 B2
(45) Date of Patent: Jun. 4, 2024

(54) READ CLOCK TOGGLE AT CONFIGURABLE PAM LEVELS

(71) Applicants: Advanced Micro Devices, Inc., Santa Clara, CA (US); ATI Technologies ULC, Markham (CA)

(72) Inventors: Aaron John Nygren, Boise, ID (US); Michael John Litt, Toronto (CA); Karthik Gopalakrishnan, Cupertino, CA (US); Tsun Ho Liu, Boston, MA (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 84 days.

(21) Appl. No.: 17/854,924

(22) Filed: Jun. 30, 2022

(65) Prior Publication Data

US 2023/0178126 A1  Jun. 8, 2023

Related U.S. Application Data

(60) Provisional application No. 63/287,148, filed on Dec. 8, 2021.

(51) Int. Cl.
  G11C 11/4076 (2006.01)
  G06F 1/08 (2006.01)
  (Continued)

(52) U.S. Cl.
  CPC ............ G11C 7/222 (2013.01); G11C 7/1063 (2013.01); G11C 7/1069 (2013.01); *G06F 1/08* (2013.01); *G06F 1/10* (2013.01); *G11C 11/4076* (2013.01)

(58) Field of Classification Search
  CPC ...... G11C 7/222; G11C 7/1063; G11C 7/1069
  (Continued)

(56) References Cited

U.S. PATENT DOCUMENTS 9,577,854 B1 * 2/2017 Hollis ................ H04L 25/4917
10,482,921 B2   11/2019 Dietrich
(Continued)

OTHER PUBLICATIONS

International Search Report and Written Opinion for International Application No. PCT/US2022/051426 dated Apr. 10, 2023, 8 pages.
(Continued)

*Primary Examiner* — Ly D Pham
(74) *Attorney, Agent, or Firm* — Polansky & Associates, P.L.L.C.; Paul J. Polansky; Nathan H. Calvert

(57) ABSTRACT

A read clock circuit selectively provides a read clock signal from a memory to a memory controller over a memory bus. A pulse-amplitude modulation (PAM) driver including an input and an output capable of driving at least three levels indicating respective digital values. A digital control circuit is coupled to the PAM driver and operable to cause the PAM driver to provide a preamble signal before the read clock signal, the preamble signal including an initial toggling state in which the PAM driver toggles between two selected levels at a first rate, and a final toggling state in which the PAM driver toggles between two selected levels at a second rate higher than the first rate, with a length of the initial toggling state and a length of the final toggling state are based on values in a mode register.

20 Claims, 5 Drawing Sheets

(51) Int. Cl.
*G06F 1/10* (2006.01)
*G11C 7/10* (2006.01)
*G11C 7/22* (2006.01)

(58) Field of Classification Search
USPC ...................................................... 365/233.1
See application file for complete search history.

(56) References Cited

U.S. PATENT DOCUMENTS

| | | | |
|---|---|---|---|
| 11,003,238 | B2 | 5/2021 | Sundararajan et al. |
| 2001/0042220 | A1 | 11/2001 | Kwak et al. |
| 2005/0089126 | A1* | 4/2005 | Zerbe .................... H04L 5/1438 |
| | | | 375/353 |
| 2005/0210179 | A1 | 9/2005 | Walmsley et al. |
| 2005/0220232 | A1 | 10/2005 | Kunnari et al. |
| 2006/0197553 | A1 | 9/2006 | Fibranz |
| 2009/0009618 | A1 | 1/2009 | Hasegawa et al. |
| 2010/0313055 | A1 | 12/2010 | Honda |
| 2011/0235459 | A1 | 9/2011 | Ware et al. |
| 2012/0051161 | A1 | 3/2012 | Grunzke |
| 2012/0300563 | A1 | 11/2012 | Kim et al. |
| 2013/0223167 | A1 | 8/2013 | Koshizuka |
| 2016/0365135 | A1 | 12/2016 | Gopalan et al. |
| 2017/0345482 | A1 | 11/2017 | Balakrishnan |
| 2018/0136843 | A1 | 5/2018 | Lee et al. |
| 2020/0020368 | A1 | 1/2020 | Yoon |
| 2020/0020380 | A1 | 1/2020 | Shin et al. |
| 2020/0027495 | A1 | 1/2020 | Takahashi |
| 2020/0267032 | A1 | 8/2020 | Hollis et al. |
| 2020/0321044 | A1 | 10/2020 | Gopalan et al. |
| 2021/0234733 | A1 | 7/2021 | Lin et al. |
| 2022/0035566 | A1 | 2/2022 | Henze et al. |
| 2022/0407506 | A1 | 12/2022 | Fiedler |
| 2023/0081557 | A1 | 3/2023 | Kang et al. |
| 2024/0029768 | A1 | 1/2024 | Go et al. |

OTHER PUBLICATIONS

"GDDR6: The Next-Generation Graphics DRAM"; Technical Note; Rev. A; Nov. 2017; Micron; 8000 S. Federal Way, Boise, ID 83707, U.S.; 22 pages.

Action on the Merits by U.S.P.T.O regarding U.S. Appl. No. 17/850,499, filed Jun. 27, 2022.

* cited by examiner

500

| OP code | Function | OP code Value | Description |
|---|---|---|---|
| [1:0] | RCKMODE | 00b<br>01b<br>10b<br>11b | Disabled (default)<br>Read Only<br>Always Running<br>RSVD |
| [2] | RCKTYPE | 0b<br>1b | Single Ended (default)<br>Differential |
| [4:3] | RCKPRE_Static | 00b<br>01b<br>10b<br>11b | 0<br>2<br>4<br>6 |
| [5] | RCKLEVEL | 0b<br>1b | +3/-3<br>+1/-1 |
| [7:6] | RCKPRE_HS | 00b<br>01b<br>10b<br>11b | 0<br>2<br>4<br>6 |
| [8] | RFU | | |
| [10:9] | RCKPRE_LS | 00b<br>01b<br>10b<br>11b | 0<br>1<br>2<br>3 |
| [11] | RFU | | |

*FIG. 5*

READ CLOCK TOGGLE AT CONFIGURABLE PAM LEVELS

This application claims priority to provisional application U.S. 63/287,148 filed Dec. 8, 2021, the entire contents of which are incorporated herein by reference.

CROSS-REFERENCE TO RELATED, COPENDING APPLICATIONS

Related subject matter is found in application Ser. No. 17/850,299, entitled "READ CLOCK START AND STOP FOR SYNCHRONOUS MEMORIES", filed Jun. 27, 2022, invented by Aaron John Nygren, Karthik Gopalakrishnan and Tsun Ho Liu, and assigned to the assignee hereof; co-pending application Ser. No. 17/850,499, entitled "READ CLOCK START AND STOP FOR SYNCHRONOUS MEMORIES", filed Jun. 27, 2022, invented by Aaron John Nygren, Karthik Gopalakrishnan and Tsun Ho Liu, and assigned to the assignee hereof; and application Ser. No. 17/850,658, entitled "READ CLOCK START AND STOP FOR SYNCHRONOUS MEMORIES", filed Jun. 27, 2022, invented by Aaron John Nygren, Karthik Gopalakrishnan and Tsun Ho Liu, and assigned to the assignee hereof.

BACKGROUND

Modern dynamic random-access memory (DRAM) provides high memory bandwidth by increasing the speed of data transmission on the bus connecting the DRAM and one or more data processors, such as graphics processing units (GPUs), central processing units (CPUs), and the like. DRAM is typically inexpensive and high density, thereby enabling large amounts of DRAM to be integrated per device. Most DRAM chips sold today are compatible with various double data rate (DDR) DRAM standards promulgated by the Joint Electron Devices Engineering Council (JEDEC). Typically, several DDR DRAM chips are combined onto a single printed circuit board substrate to form a memory module that can provide not only relatively high speed but also scalability. However, while these enhancements have improved the speed of DDR memory used for computer systems' main memory, further improvements are desirable.

One type of DDR DRAM, known as graphics double data rate (GDDR) memory, has pushed the boundaries of data transmission rates to accommodate the high bandwidth needed for graphics applications. As new GDDR standard are developed, they tend to support higher data rates. One technique used to support higher data rates is a multi-level pulse amplitude modulation (PAM) data transmission and reception mode instead of a conventional two-level transmission system. With more PAM levels, the data transmission bandwidth can be increased for a given clock speed. However continuous data transmission at these high speeds results in relatively high power consumption.

BRIEF DESCRIPTION OF THE DRAWINGS

FIG. 5 shows a table including mode register setting for read clock configuration according to some embodiments.

Figure 1:
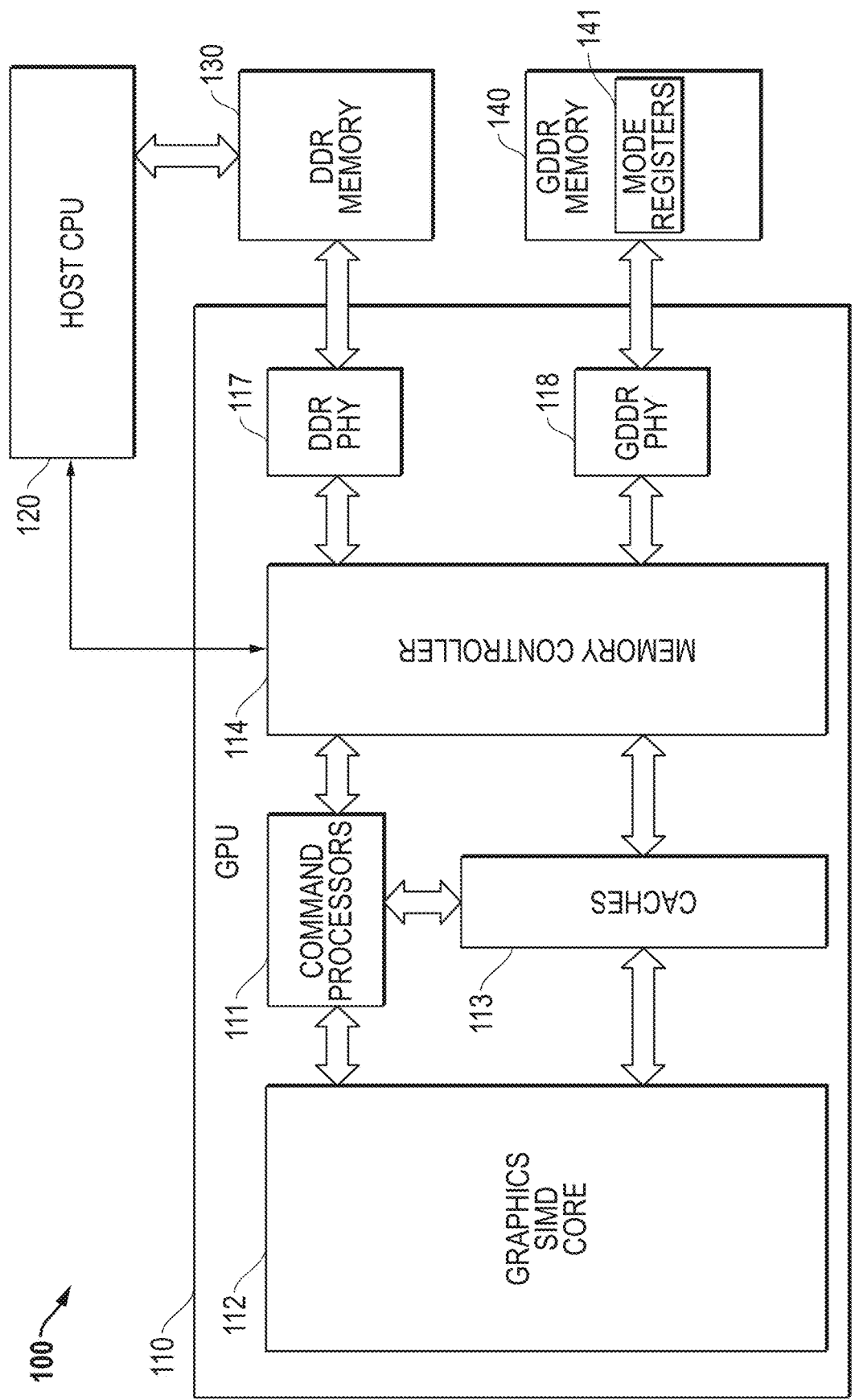
FIG. 1 illustrates in block diagram for a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A read clock circuit for selectively providing a read clock signal from a memory to a memory controller over a memory bus includes a pulse-amplitude modulation (PAM) driver, a mode register, and a digital control circuit. The PAM driver includes an input and an output capable of driving at least three levels indicating respective digital values. The digital control circuit coupled to the input of the PAM driver and operable to cause the PAM driver to provide a preamble signal before the read clock signal, the preamble signal including an initial toggling state in which the PAM driver toggles between two selected levels at a first rate, and a final toggling state in which the PAM driver toggles between two selected levels at a second rate higher than the first rate. A length of the initial toggling state and a length of the final toggling state are based on values in the mode register.

A method selectively provides a read clock signal from a memory to a memory controller over a memory bus. The method includes deactivating a pulse-amplitude modulation (PAM) driver, capable of driving at least three levels indicating respective digital values, for a read clock signal following a memory read. Responsive to a new memory read, the method includes activating the PAM driver and providing a preamble signal for a read clock signal, the preamble signal including, in order, at least one static state, an initial toggling state in which the PAM driver toggles between two selected levels at a first rate, and a final toggling state in which the PAM driver toggles between two selected levels at a second rate higher than the first rate. The method includes determining a length of at least the initial toggling state and the final toggling state based on values in mode register, and following the preamble, toggling the PAM driver at the second rate to provide the read clock signal.

A data processing system includes at least one processor, a memory controller coupled to the processor over a memory bus, and a dynamic random-access memory (DRAM) coupled to the memory controller over a memory bus, the DRAM including a read clock circuit for selectively providing a read clock signal from a memory to the memory controller over the memory bus. The read clock circuit includes a pulse-amplitude modulation (PAM) driver, a mode register, and a digital control circuit. The PAM driver includes an input and an output capable of driving at least three levels indicating respective digital values. The digital control circuit coupled to the input of the PAM driver and operable to cause the PAM driver to provide a preamble signal before the read clock signal, the preamble signal including an initial toggling state in which the PAM driver toggles between two selected levels at a first rate, and a final toggling state in which the PAM driver toggles between two selected levels at a second rate higher than the first rate. A length of the initial toggling state and a length of the final toggling state are based on values in the mode register.

FIG. 1 illustrates in block diagram for a data processing system 100 according to some embodiments. Data processing system 100 includes generally a data processor in the form of a graphics processing unit (GPU) 110, a host central processing unit (CPU) 120, a double data rate (DDR) memory 130, and a graphics DDR (GDDR) memory 140.

GPU 110 is a discrete graphics processor that has extremely high performance for optimized graphics processing, rendering, and display, but requires a high memory bandwidth for performing these tasks. GPU 110 includes generally a set of command processors 111, a graphics single instruction, multiple data (SIMD) core 112, a set of caches 113, a memory controller 114, a DDR physical interface circuit (DDR PHY) 117, and a GDDR PHY 118.

Command processors 111 are used to interpret high-level graphics instructions such as those specified in the OpenGL programming language. Command processors 111 have a bidirectional connection to memory controller 114 for receiving high-level graphics instructions such as OpenGL instructions, a bidirectional connection to caches 113, and a bidirectional connection to graphics SIMD core 112. In response to receiving the high-level instructions, command processors issue low-level instructions for rendering, geometric processing, shading, and rasterizing of data, such as frame data, using caches 113 as temporary storage. In response to the graphics instructions, graphics SIMD core 112 performs low-level instructions on a large data set in a massively parallel fashion. Command processors 111 and caches 113 are used for temporary storage of input data and output (e.g., rendered and rasterized) data. Caches 113 also have a bidirectional connection to graphics SIMD core 112, and a bidirectional connection to memory controller 114.

Memory controller 114 has a first upstream port connected to command processors 111, a second upstream port connected to caches 113, a first downstream bidirectional port to DDR PHY 117, and a second downstream bidirectional port to GDDR PHY 118. As used herein, "upstream" ports are on a side of a circuit toward a data processor and away from a memory, and "downstream" ports are in a direction away from the data processor and toward a memory. Memory controller 114 controls the timing and sequencing of data transfers to and from DDR memory 130 and GDDR memory 140. DDR and GDDR memory have asymmetric accesses, that is, accesses to open pages in the memory are faster than accesses to closed pages. Memory controller 114 stores memory access commands and processes them out-of-order for efficiency by, e.g., favoring accesses to open pages, while observing certain quality-of-service objectives.

DDR PHY 117 has an upstream port connected to the first downstream port of memory controller 114, and a downstream port bidirectionally connected to DDR memory 130. DDR PHY 117 meets all specified timing parameters of the version of DDR memory 130, such as DDR version five (DDR5), and performs timing calibration operations at the direction of memory controller 114. Likewise, GDDR PHY 118 has an upstream port connected to the second downstream port of memory controller 114, and a downstream port bidirectionally connected to GDDR memory 140. GDDR PHY 118 meets all specified timing parameters of the version of GDDR memory 140, and performs timing calibration operations at the direction of memory controller 114.

GDDR memory 140 includes a set of mode registers 141 programmable over the GDDR PHY 118 to configure GDDR memory 140 for operation. In particular, as set forth herein, the read clock (RCK) that GDDR memory 140 provides to GDDR PHY 118 can be programmed to operate in certain new and advantageous ways. According to some embodiments, the read clock can be configured to operate in a "read-only" mode in the RCK signal saves power by not toggling continuously, and instead starts toggling during a read preamble period before a data transmission of a read command, and to continue to toggle at least to the end of a read postamble period following the read command. The read-only mode provides the ability to reduce power consumption during workloads in which read operations are or can be infrequent. The read clock RCK is also programmable to operate in an "always-on" mode, in which GDDR memory 140 provides the RCK signal continuously as long as a write clock (WCK) is received from the host, e.g., the memory controller or memory PHY of a host processor chip. The always on mode provides the ability for the host processor PHY to stay locked and avoid the need for resynchronization during a preamble period. While certain techniques for controlling a RCK preamble are provided below in the context of a RCK operable in these two modes, the techniques are also applicable to the preamble of RCK circuits which do not have a read-only mode in various embodiments.

In operation, data processing system can be used as a graphics card or accelerator because of the high bandwidth graphics processing performed by graphics SIMD core 112. Host CPU 120, running an operating system or an application program, sends graphics processing commands to CPU 110 through DDR memory 130, which serves as a unified memory for GPU 110 and host CPU 120. It may send the commands using, for example, as OpenGL commands, or through any other host CPU to GPU interface. OpenGL was developed by the Khronos Group, and is a cross-language, cross-platform application programming interface for rendering 2D and 3D vector graphics. Host CPU 120 uses an application programming interface (API) to interact with GPU 110 to provide hardware-accelerated rendering.

Data processing system 100 uses two types of memory. The first type of memory is DDR memory 130, and is accessible by both GPU 110 and host CPU 120. As part of the high performance of graphics SIMD core 112, GPU 110 uses a high-speed graphics double data rate (GDDR) memory.

Figure 2:
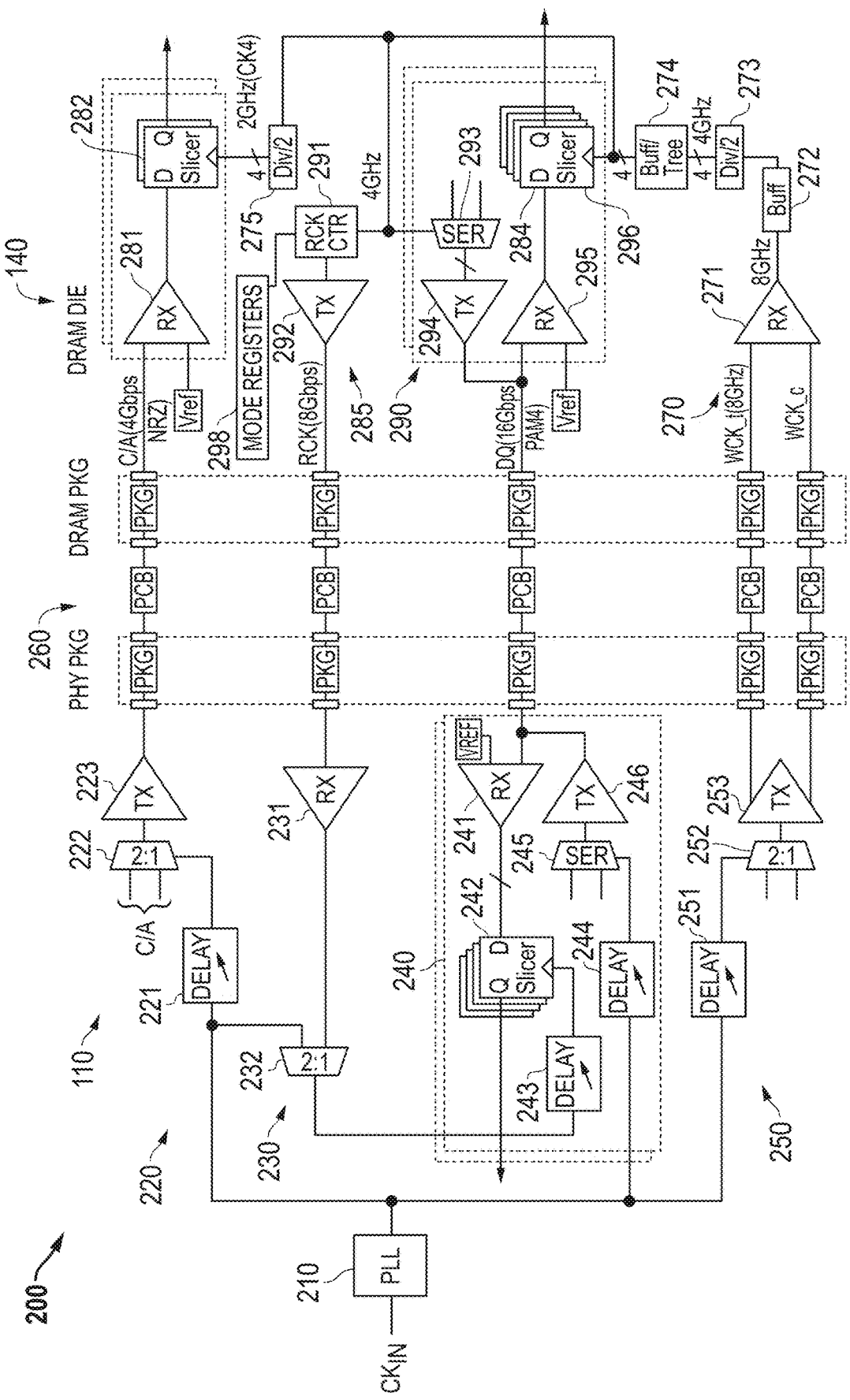
FIG. 2 illustrates in block diagram form a GDDR PHY-DRAM link of the data processing system of FIG. 1.

FIG. 2 illustrates in block diagram form a GDDR PHY-DRAM link 200 of data processing system 100 of FIG. 1 according to some embodiments. GDDR PHY-DRAM link 200 includes portions of GPU 110 and GDDR memory 140 that communicate over a physical interface 260.

GPU 110 includes a phase locked loop (PLL) 210, a command and address ("C/A") circuit 220, a read clock circuit 230, a data circuit 240, and a write clock circuit 250. These circuits form part of GDDR PHY 118 of GPU 110.

Phase locked loop 210 operates as a reference clock generation circuit and has an input for receiving an input clock signal labelled "$CK_{IN}$", and an output.

C/A circuit 220 includes a delay element 221, a selector 222, and a transmit buffer 223 labelled "TX". Delay element 221 has an input connected to the output of PLL 210, and an output, and has a variable delay controlled by an input, not specifically shown in FIG. 2. Selector 222 has a first input for receiving a first command/address value, a second input for receiving a second command/address value, and a control input connected to the output of delay element 221. Transmitter 223 has an input connected to the output of selector 222, and an output connected to a corresponding integrated circuit terminal for providing a command/address signal labelled "C/A" thereto. Note that C/A circuit 220 includes a set of individual buffers for each signal in the C/A signal group that are constructed the same as the representative selector 222 and buffer 223 shown in FIG. 2, but only a representative C/A circuit 220 is shown.

Read clock circuit 230 include a receive buffer 231 labelled "RX", and a selector 232. Receive buffer 231 has an input connected to a corresponding integrated circuit terminal for receiving a signal labelled "RCK", and an output. Receive clock selector 232 has a first input for connected to the output of PLL 210, a second input connected to the output of receive buffer 231, an output, and a control input for receiving a mode signal, not shown in FIG. 2.

Data circuit 240 includes a receive buffer 241, a latch 242, delay elements 243 and 244, a serializer 245, and a transmit buffer 246. Receive buffer 241 has a first input connected to an integrated circuit terminal that receives a data signal labelled generically as "DQ", a second input for receiving a reference voltage labelled "$V_{REF}$", and an output. Latch 242 is a D-type latch having an input labelled "D" connected to the output of receive buffer 241, a clock input, and an output labelled "Q" for providing an output data signal. The interface between GDDR PHY 118 and GDDR memory 140 implements a four-level, pulse amplitude modulation data signaling system known as "PAM-4", which encodes two data bits into one of four nominal voltage levels. Thus, receive buffer 241 discriminates which of the four levels is indicated by the input voltage, and outputs two data bits to represent the state in response. For example, receive buffer 241 could generate three slicing levels based on $V_{REF}$ defining four ranges of voltages, and use three comparators to determine which range the received data signal falls in. Data circuit 240 includes latches which latch the two data bits and is replicated for each bit position. Delay element 243 has an input connected to the output of selector 232, and an output connected to the clock input of latch 242. Delay element 244 has an input connected to the output of PLL 210, and an output. Serializer 245 has inputs for receiving a first data value of a given bit position and a second data value of the given bit position, the first and second data values corresponding to sequential cycles of a burst, a control input connected to the output of delay element 244, and an output connected to the corresponding DR terminal. Each data byte of the data bus has a set of data circuits like data circuit 240 for each bit of the byte. This replication allows different data bytes that have different routing on the printed circuit board to have different delay values.

Write clock circuit 250 includes a delay element 251, a selector 252, and a transmit buffer 253. Delay element 251 has an input connected to the output of PLL 210, and an output. Selector 252 has a first input for receiving a first clock state signal, a second input for receiving a second clock voltage, a control input connected to the output of delay element 251, and an output. Transmit buffer 253 has an input connected to the output of selector 252, and an output a first output connected to a corresponding integrated circuit terminal for providing a true write clock signal labelled "WCK t" thereto, and a second output connected to a corresponding integrated circuit terminal for providing a complement write clock signal labelled "WCK_c" thereto.

GDDR memory 140 includes generally a write clock receiver 270, a command/address receiver 280, and a data path transceiver 290. Write clock receiver 270 includes a receive buffer 271, a buffer 272, a divider 273, a buffer/tree 274, and a divider 275. Receive buffer 271 has a first input connected to an integrated circuit terminal of GDDR memory 140 that receives the WCK t signal, a second input connected to an integrated circuit terminal of GDDR memory 140 that receives the WCK_c signal, and an output. In the example shown in FIG. 2, the output of receive buffer 271 is clock signal having a nominal frequency of 8 GHz. Buffer 272 has an input connected to the output of receive buffer 271, and an output. Divider 273 has an input connected the output of buffer 272, and an output for providing a divided clock having a nominal frequency of 4 GHz. Divider 275 has an input for connected to the output of buffer/tree 274, and an output for providing a clock signal labelled "CK4" having a nominal frequency of 2 GHz.

Command/address receiver 280 includes a receive buffer 281 and a slicer 282. Receive buffer 281 has a first input connected to a corresponding integrated circuit terminal of GDDR memory 140 that receives the C/A signal, a second input for receiving $V_{REF}$, and an output. The C/A input signal is received as a normal binary signal having two logic states levels and is considered a non-return-to-zero (NRZ) signal encoding. Slicer 282 has a set of two data latches each having a D input connected to the output of receive buffer 281, a clock input for receiving a corresponding one of the output of divider 275, and a Q output for providing a corresponding C/A signal.

Data path transceiver 290 includes a read clock circuit 285, a serializer 293, a transmitter 294, a receive buffer 295, and a slicer 296. Serializer 293 has an input for receiving a first read data value, a second input for receiving a second data value, a select input connected to the output of buffer/tree 274, and an output connected to the DQ terminal of GDDR memory 140. Transmitter 294 has an input connected to the output of serializer 293, and an output connected to the corresponding DQ terminal of GDDR memory 140. Receive buffer 295 has a first input connected to the corresponding DQ terminal of GDDR memory 140, a second input for receiving the $V_{REF}$ value, and an output. Slicer 296 has a set of four data latches each having a D input connected to the output of receive buffer 295, a clock input connected to the output of buffer/tree 274, and a Q output for providing a corresponding DQ signal.

Read clock circuit 285 includes a read clock control circuit 291, a transmitter 292, and a mode register 298. Read clock control circuit 291 has an input connected to mode register 298, an input connected the output of buffer/tree 274, and an output. Transmitter 292 has an input connected to the output of serializer 291, and an output connected to the RCK terminal of GDDR memory 140 to provide a read clock signal "RCK", which below refers to the signal and the depicted terminal on which it is driven. Transmitter 292 is a PAM driver capable of driving more than two PAM levels. In operation, read clock control circuit 291 controls the transmitter 292 to provide a preamble signal before the read clock signal RCK. As further described below, the preamble signal including an initial toggling state in which the PAM driver toggles between two selected levels at a first rate, and a final toggling state in which the PAM driver toggles between two selected levels at a second rate higher than the first rate. A length of the initial toggling state and a length of the final toggling state are based on values in mode register 298.

Interface 260 includes a set of physical connections that are routed between a bond pad of the GPU 110 die, through a package impedance to a package terminal, through a trace on a printed circuit board, to a package terminal of GDDR memory 140, through a package impedance, and to a bond pad of the GDDR memory 140 die.

Figure 3:
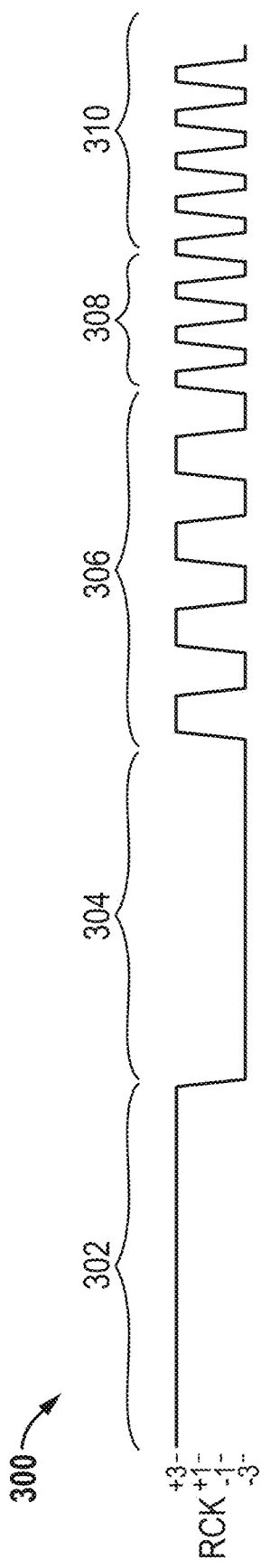
FIG. 3 shows a timing diagram of a read clock signal preamble signal according to some embodiments.

FIG. 3 shows a timing diagram of a read clock signal preamble signal 300 according to some embodiments. The vertical axis shows the signal level selected from among four depicted PAM4 levels labelled −3, −1, +1, and +3, which correspond to voltage levels between the signaling voltage supply level and zero volts in this embodiment. It is noted that labels for PAM levels are merely a convention to refer to the PAM levels, and another common convention is use a binary scheme of 00, 01, 10, and 11 to refer to the same levels. The actual levels are analog voltage levels which typically adjusted by the driver during operation, and vary depending on the supply voltage. The horizontal axis depicts time. Generally, the preamble signal helps the PAM receiver begin to receive the read clock signal such that the receivers on the memory controller PHY can synchronize with read data signal.

Preamble signal 300 is transmitted following a period in which the RCK signal has been deactivated. Responsive to a new read command, the RAM (in this example, a GDDR memory such as GDDR memory 200 of FIG. 2) activates the PAM driver for RCK and provides a preamble signal 300 for the read clock signal. Preamble signal 300 includes in order, two static states 302 and 304, an initial toggling state 306, a final toggling state 308, and a clock operation state 310.

While two static states 302 and 304 are employed in this example preamble signal, other preamble signals may include only one static state. In initial static state 302, the PAM4 driver is held at the highest PAM4 level for a period of two clock cycles relative to the final frequency of the internal memory clock. In this example, the internal memory clock is the internal "CK4" clock of a GDDR memory, which is created from the "WCK" write clock on the memory channel, for example at a frequency of ¼ of WCK. Initial static state 302 lasts for two cycles of the CK4 clock, but could be programmed to be longer or shorter as will be described below.

In static state 304, the PAM4 driver is driven to its lowest level, typically a 0V level, which is designated as the "−3" level in this embodiment. Static state 304 also lasts for two cycles of the CK4 clock in this example.

Following static state 304, preamble signal 300 includes initial toggling state 306, in which the PAM driver toggles between two selected levels at a first rate. In this example, the toggling rate is twice the CK4 clock rate, or ½ of the MCK clock rate. Next, preamble signal 300 transitions to the final togging state 308, in which the PAM4 driver toggles between two selected levels at a second rate higher than the first rate. During final toggling state 308, the PAM4 receivers are able to stabilize their reception of the RCK clock signal.

Following final toggling state 308, the RCK clock signal transitions out of the preamble and into RCK clock operation in which an RCK clock signal is provided in clock operation state 310. Preferably, the frequency of RCK clock signal is the same as the togging rate employed in final toggling state 308.

Figure 4:
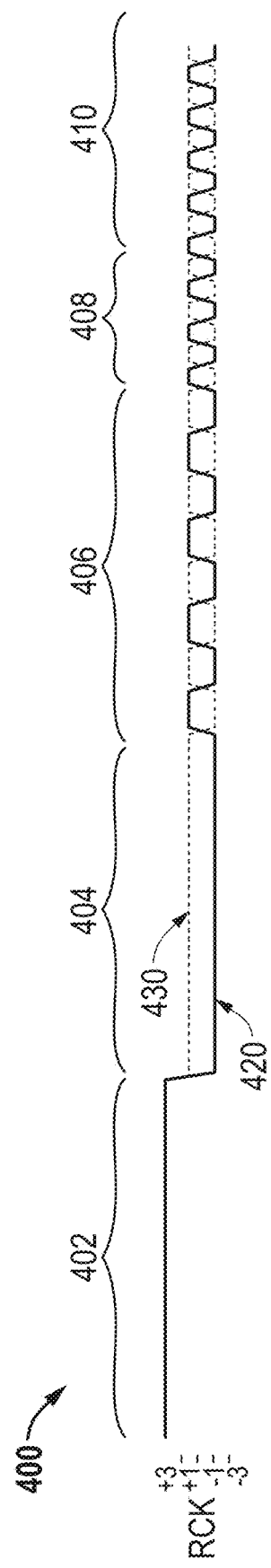
FIG. 4 shows a timing diagram of a read clock signal preamble signal according to some additional embodiments.

FIG. 4 shows a timing diagram of a read clock signal preamble signal 400 according to some additional embodiments. The diagram is arranged like that of FIG. 4. The depicted preamble signal 400 illustrates an example of some ways in which the preamble signal may be altered by settings in the mode register 141. Preamble signal 400 includes in order, two static states 402 and 404, an initial toggling state 406, a final toggling state 408, and a clock operation state 410.

In preamble signal 400, the timing of the various states is like that of FIG. 4, while the PAM4 levels employed are different. In this example, different values are set for the two selected levels 420 and 430 employed during the toggling states based on values in mode register 141. While static state 402 is set to the +3 PAM4 level, static state 404 is set to the −1 PAM4 level, and in toggling states 406 and 408, preamble signal 400 toggles between PAM4 levels −1 and +1, as depicted. Finally in the clock operation state, the RCK clock signal toggles between PAM4 levels −1 and +1.

The two selected levels are based on values in the mode register 298. While in this implementation, a limited set of levels is configurable for the pair of PAM levels as described below with respect to FIG. 5, in other implementations the settings in mode register 298 are able to configure any pair of PAM levels to be used in any of states 402, 404, 406, 408, and 410. Different pairs of PAM levels are able to be used in different states. Preferably, the two selected levels in final toggling state 408 are those employed for the read clock signal during a read operation in state 410. The two selected levels during initial toggling state 406 may be different from those in the final toggling state. While only an initial and final togging state are used in this example preamble signal 400, additional toggling states may be used which speed up the toggling rate between initial toggling state 406 between initial toggling state 406 and final toggling state 408.

In this embodiment, the PAM driver (FIG. 2, 292) employed is a PAM-4 driver capable of driving four levels indicating respective two-bit digital values relative to a signaling supply voltage of 1.2 volts, making the identified levels of −3, −1, +1, and +3 approximately 0V, 0.4V, 0.8V, and 1.2V, respectively. Preferably, the signaling level can be adjusted in order to save power, providing for a lower maximum level (+3), with the other levels being lowered accordingly. In other embodiments, other PAM drivers are employed, such as PAM-6 or PAM-8. Generally, the techniques herein are suitable for use with any PAM driver capable of driving more than two voltage levels.

FIG. 5 illustrates a table 500 showing a mode register setting for the read clock modes of the memory of FIG. 2. Table 500 shows a value of different bits or bit fields of a 12-bit mode register, in which the twelve bits correspond to address signals by which the mode registers are loaded. Table 500 has six columns, including an OP code (operational code) column corresponding to certain bit or bits of the mode register, a Function column identifying the function defined by the corresponding bits, an OP code Value column specifying the different values of the OP code, and a Description column identifying the meaning of the different OP code values.

Mode register bits [1:0] are labelled "RCKMODE" and identify the selected RCK mode. A value of 00b (binary) identifies the Disabled mode, in which the RCK is not provided by memory 200. This mode is the default mode.

A value of 01b indicates the Read Only mode. As will be described further below, in the Read Only mode, RCK is provided during one or more read cycles and each read cycle contains both a preamble and a postamble. When Read Only mode is selected, an interamble behavior is defined when consecutive reads are separated by more than the minimum amount of spacing, i.e., by at least $t_{CCD}$+1 RCK cycles, in which $t_{CCD}$ is the minimum command-to-command delay time. In general, during the Read Data mode, the RCK starts a preamble period before the transfer of data in a read cycle, and ends a preamble period after a read cycle. In particular, it starts toggling coincident with data transfer for a read command (RD), a read with auto-precharge command (RDA), and with a read training (RDTR) command. It stops with a clear condition. In some embodiments, the clear condition includes receipt of a write command (a write command (WR), a write with auto-precharge command (WRA), or a write training (WRTR) command), receipt of an all banks idle state indication, or entry into a power down state.

A value of 10b indicates an Always Running mode. In the Always Running mode, RCK runs continuously as long as WCK, used to generate RCK, is received by memory 200.

A value of 11b is reserved (RSVD) but allows the definition of a new mode of providing the RCK signal to be added in the future using this mode register structure.

Mode register bit [2] defines a read clock type (RCK-TYPE). A value of 0b indicates that GDDR memory 200 provides the RCK signal as a single-ended signal, i.e., RCK does not toggle. A value of 1b indicates that the both the RCK and the RCK signals toggle as a differential signal.

Mode register bits [4:3] define the length of the static preamble period. To allow a memory controller to lock to the preamble, each preamble period has a static period, a low-speed period, and a high-speed period. In the example preamble signals of FIG. 3 and FIG. 4, the static states 304 and 404 represent a static period, the initial toggling states 306 and 406 represent a low speed period, and the final toggling states 308 and 408 represent a high-speed period. During the static period, the read clock signal is driven in its inactive state, i.e., RCK is driven low and RCK is driven high. A value of 00b indicates a static period of 0 clock cycles, i.e., no static period. Values of 01b, 10b, and 11b define static periods of 2, 4, and 6 cycles, respectively.

Mode register bit [5] defines an RCK level setting (RCK-LEVEL), which in this example provides for two possible value pairs of the RCK levels during the RCK preamble and RCK operation. A value of 0b defines +3/−3 values for the RCK signal's PAM driver, and a value of 1b defines values of +1/−1. While these value pairs are shown as an example, in various embodiments configuration settings can be used to program any desired pair of values, including defining different pairs of values in each phase of the preamble.

Mode register bits [7:6] define the length of the high-speed preamble period. A value of 00b indicates a high-speed preamble period of 0 clock cycles, i.e., no high-speed preamble period. Values of 01b, 10b, and 11b define static periods of 2, 4, and 6 cycles, respectively.

Mode register bit [8] is not defined and is as reserved for future use (RFU).

Mode register bits [10:9] define the length of the low-speed preamble period. A value of 00b indicates a low-speed preamble period of 0 clock cycles, i.e., no low-speed preamble period. Values of 01b, 10b, and 11b define static periods of 1, 2, and 3 cycles. Note that while the high-speed and low-speed preamble periods are independently programmable, if OP code bits [7:6] and [10:9] have the same values, then the high-speed and low-speed preambles are the same lengths of time.

Mode register bit [11] is not defined and is shown as RFU.

It should be apparent that these mode register encodings are just one possible way to encode these values, and other encodings are possible. For example, instead of using a dedicated mode register, these bits can be distributed among multiple mode registers, for example in otherwise unused or reserved bit positions. Moreover, the choice of available values for the static, low-speed, and high-speed preamble are somewhat arbitrary and may be varied in difference embodiments.

Figure 6:
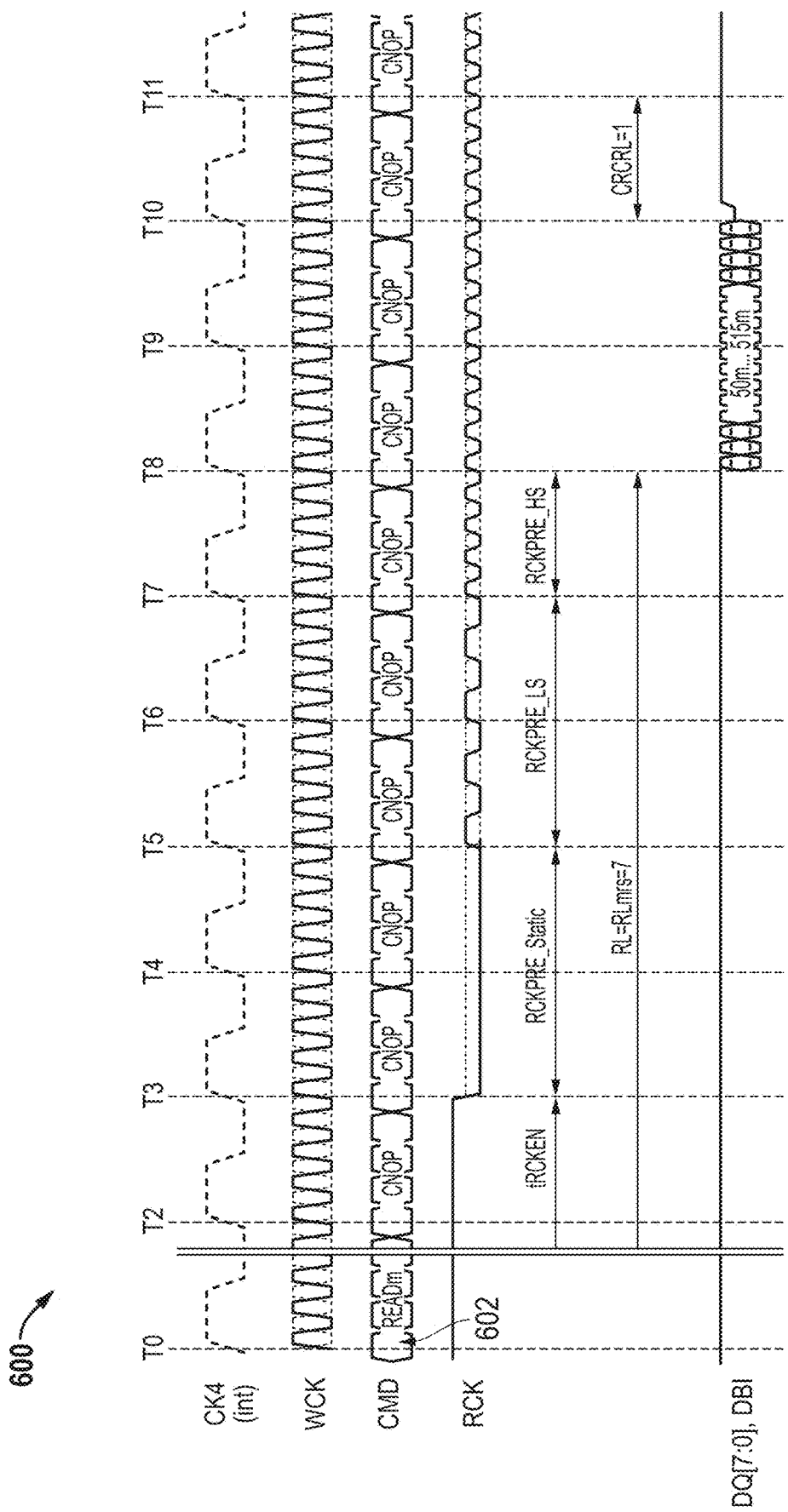
FIG. 6 shows a timing diagram showing the relationship of various signals at a GDDR memory according to some embodiments.

FIG. 6 shows a timing diagram 600 showing the relationship of various signals at a GDDR memory according to some embodiments. Diagram 600 includes an internal memory clock signal labelled "CK4", a write clock signal labelled "WCK", a command signal labelled "CMD", read clock signal RCK, and a set of data signals including a data bus inversion signal labelled "DQ[7:0], DBI". The horizontal axis represents time, and the vertical axis represents the amplitude of the various signals in volts.

Diagram 600 depicts an exemplary sequence in which a read command 602 is received at the memory with the RCK configured as discussed above in Read Only mode. The CK4 signal is generated based on the received WCK signal at a 4:1 ratio in this implementation. For example, if WCK is 8 Ghz, CK4 is 2 Ghz. Dashed lines show low-to-high transitions of the CK4 signal and correspond to various time points labeled T0-T11. Diagram 600 shows active command encodings for the COMMAND signal, while no operation cycles are shown.

In the example scenario shown in timing diagram 600, mode register 300 has been programmed for RCKMODE=Read Only, RCKTYPE=Single Ended, RCKPRE_Static=2, RCKPRE_LS=2, RCKPRE_HS=1, and RCKLEVEL=1. Diagram 600 shows the issuance of a read command labelled "READm" at time T0. Because of the read latency, memory 200 does not provide the read data until time T8. During this time the RCK signal includes a preamble defined by the configuration settings in mode register 298 according to FIG. 5 to both activate the read clock to provide the signal RCK and to allow the receiver at the memory controller to synchronize with the RCK signal in an efficient manner.

Responsive to the read command READm received at time T0, first the RCK driver needs to be enabled. A time of two cycles of CK4 is needed to enable the RCK clock driver, as shown by the time "tRCKEN". During this time the output of the RCK driver (for example, FIG. 2, 292) is undefined but typically expected to be high as shown by RCK from T0 to T3.

At time T3, a static period is begun with the RCK signal driven at the −1 level. The length of this static period is controlled by the RCKPRE_Static setting in the mode register. In this example, the length is two cycles of CK4.

At time T5, an initial toggling period is begun with a length controlled by the RCKPRE_LS setting. During this period, RCK toggles between the two selected levels of +1 and −1 at a rate of twice that of CK4, and half that of WCK. While this toggling rate is shown, other toggling rates may be used. Typically the togging in the initial toggling period is lower speed than the final toggling rate to help the PAM receiver lock onto the RCK signal.

At time T7, a final toggling period is begun with a length controlled by the RCKPRE_HS setting. The toggling rate during this period is preferably the same as the RCK toggling rate following the preamble, which in this example is the rate of WCK. Other rates, such as half of the WCK rate, may be used. It is noted that, while in this example the same pair of levels is used in both toggling periods of the preamble, different levels may be used.

At time T8, the final toggling period ends and the preamble is complete. At this time, RCK continues to toggle at the rate of WCK and the PAM for the RCK signal is synchronized on the RCK signal. As seen in the DQ[7:0], DBI signal, the read command is fulfilled with data transmitted to the memory controller, in this example for two cycles of CK4 from T8 to T10. PAM receivers for each data line of the data channel used in the read operation are clocked using the received RCK signal. Following T10, RCK may continue to operate for transmission of data such as metadata over a DQE signal, with a receiver at the memory controller for the DQE signal also employing RCK for synchronization. In some implementations, during a Read Only mode, the RCK signal may continue to toggle as a read clock for multiple sequential read commands.

Other related events may also occur on the GDDR memory during the preamble. For example, in embodiments which employ switchable on-die termination (ODT), the ODT may be switched from enabled to disabled during the slow toggling period.

Thus, the technique disclosed herein can be used to improve data transmission bandwidth by transmitting non-binary symbols, i.e., symbols having more than two states per clock edge. It is believed that the noise-mitigation techniques may allow PAM4 reception in systems that would not otherwise be robust enough to decode the four voltage levels use in PAM4 symbols at existing clock speeds. According to the disclosed embodiments, a memory transmits an RCK signal with a preamble having programmable PAM levels and durations, allowing for greater flexibility in different system characteristics and receiver designs.

An integrated circuit or integrated circuits containing the reference voltage generation circuits described herein, or any portions thereof, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, various PAM driver designs may be used with different numbers of PAM levels. Further, various ways of configuring the read clock driver control circuit may be used to achieve the desired configurability. The disclosed technique is applicable to a wide variety of integrated circuits that use high-speed data transmission. In one particular example, one integrated circuit can be a data processor, system-on-chip (SOC), or graphics processing unit (GPU), while the other integrated circuit is a DDR or GDDR SDRAM, but the techniques described herein can be used with many other types of integrated circuits. The transmission medium can also vary between embodiments, and may include printed circuit board traces, bond wires, through-silicon vias (TSVs), and the like.

Accordingly, it is intended by the appended claims to cover all modifications of the disclosed embodiments that fall within the scope of the disclosed embodiments.

What is claimed is:

1. A read clock circuit for selectively providing a read clock signal from a memory to a memory controller over a memory bus, comprising:
    a pulse-amplitude modulation multi-level (PAM) driver including an input and an output capable of driving at least three levels indicating respective digital values;
    a mode register;
    and a digital control circuit coupled to the input of the PAM driver and operable to cause the PAM driver to provide a preamble signal before the read clock signal, the preamble signal including an initial toggling state in which the PAM driver toggles between two selected levels at a first rate, and a final toggling state in which the PAM driver toggles between two selected levels at a second rate higher than the first rate, and
    wherein a length of the initial toggling state and a length of the final toggling state are based on values in the mode register.

2. The read clock circuit of claim 1, wherein the two selected levels are based on one or more values in the mode register.

3. The read clock circuit of claim 1, wherein the digital control circuit is operable to cause the PAM driver to provide at least one static state in the preamble before the initial toggling state.

4. The read clock circuit of claim 1, wherein the two selected levels in the final toggling state are those employed for the read clock signal during the read operation.

5. The read clock circuit of claim 1, wherein the two selected levels during the initial toggling state are different from those in the final toggling state.

6. The read clock circuit of claim 1, wherein the digital control circuit is configurable to include a second toggling state between the initial toggling state and the final toggling state, the second toggling state toggling at a rate between those of the initial toggling state and the final toggling state.

7. A method for selectively providing a read clock signal from a memory to a memory controller over a memory bus, the method comprising:
    deactivating a pulse-amplitude modulation (PAM) driver, capable of driving at least three levels indicating respective digital values, for a read clock signal following a memory read;
    responsive to a new memory read, activating the PAM driver and providing a preamble signal for a read clock signal, the preamble signal including, in order, at least one static state, an initial toggling state in which the PAM driver toggles between two selected levels at a first rate, and a final toggling state in which the PAM driver toggles between two selected levels at a second rate higher than the first rate;
    determining a length of at least the initial toggling state and the final toggling state based on values in mode register; and
    following the preamble, toggling the PAM driver at the second rate to provide the read clock signal.

8. The method of claim 7, wherein the two selected levels are based on one or more values in the mode register.

9. The method of claim 7, further comprising providing at least one static state in the preamble before the initial toggling state.

10. The method of claim 7, wherein the two selected levels in the final toggling state are those employed for the read clock signal during a read operation.

11. The method of claim 7, wherein the two selected levels during the initial toggling state are different from those in the final toggling state.

12. The method of claim 7, further comprising providing a second toggling state between the initial toggling state and the final toggling state, the second toggling state toggling at a rate between those of the initial toggling state and the final toggling state.

13. The method of claim 7, wherein the PAM driver is capable of driving four levels indicating respective two-bit digital values relative to a signaling supply voltage of 1.2 volts.

14. The method of claim 7, wherein a toggling rate of the read clock is based on a toggling rate of a write clock received at the memory from the memory controller.

15. A data processing system comprising:
- at least one processor;
- a memory controller coupled to the processor over a memory bus; and
- a dynamic random-access memory (DRAM) coupled to the memory controller over a memory bus, the DRAM including read clock (strobe) circuit for selectively providing a read clock signal from a memory to the memory controller over the memory bus, comprising:
  - a pulse-amplitude modulation (PAM) driver including an input and an output capable of driving at least three levels indicating respective digital values;
  - a mode register; and
  - and a digital control circuit coupled to the input of the PAM driver, the digital control circuit operable to cause the PAM driver to selectively provide the read clock signal during a read operation, and to cause the PAM driver to provide a preamble signal before the read clock signal, the preamble signal including, an initial toggling state in which the PAM driver toggles between two selected levels at a first rate, and a final toggling state in which the PAM driver toggles between two selected levels at a second rate higher than the first rate, and
  - wherein a length of the initial toggling state and a length of the final toggling state are based on values in the mode register.

16. The data processing system of claim 15, wherein the two selected levels are based on one or more values in the mode register.

17. The data processing system of claim 15, wherein the digital control circuit is operable to cause the PAM driver to provide at least one static state in the preamble signal before the initial toggling state.

18. The data processing system of claim 15, wherein the two selected levels in the final toggling state are those employed for the read clock signal during the read operation.

19. The data processing system of claim 15, wherein the two selected levels during the initial toggling state are different from those in the final toggling state.

20. The data processing system of claim 15, wherein the digital control circuit is configurable to include a second toggling state between the initial toggling state and the final toggling state, the second toggling state including toggling at a rate between those of the initial toggling state and the final toggling state.

* * * * *